United States Patent [19]

Maclaren

[11] 4,130,798

[45] Dec. 19, 1978

[54] UNIMETER FOR DETECTION AND INDICATION OF ELECTRIC CHARGE VARIATION

[76] Inventor: Arthur H. Maclaren, 135 Livingston St., Tewksbury, Mass. 01876

[21] Appl. No.: 854,807

[22] Filed: Nov. 25, 1977

[51] Int. Cl.$^2$ ............................................ G01R 31/02
[52] U.S. Cl. ...................................... 324/72; 324/32; 324/93; 324/111
[58] Field of Search ....................... 324/32, 72, 93, 94, 324/123 R, 111

[56] References Cited

U.S. PATENT DOCUMENTS

| 2,802,918 | 8/1957 | Boyle | 324/93 |
|---|---|---|---|
| 3,119,984 | 1/1964 | Brandt et al. | 324/111 |
| 3,866,114 | 2/1975 | Johnston | 324/32 |

*Primary Examiner*—M. Tokar

*Attorney, Agent, or Firm*—Pfund, Charles E.

[57] ABSTRACT

A novel method for detecting charge on large bodies such as the earth is accomplished by means of disclosed apparatus which includes a vertical column of mercury having an associated electrode which is capacitively coupled to the mercury column when the mercury level is above the position of the electrode. By establishing an initial unipotential state for the apparatus by short circuit connection of the electrode and mercury column to the earth and an electrometer connected between the electrode and the earth which is initially short-circuited across its terminals the apparatus is conditioned to sense the charge of the large body to which it is connected (the earth) by moving the mercury column up and down past the position of the electrode with the electrometer open-circuited and thus connected between the electrode and earth during the passage of the mercury in one direction past the electrode.

12 Claims, 5 Drawing Figures

UNIMETER FOR DETECTION AND INDICATION OF ELECTRIC CHARGE VARIATION

BACKGROUND OF THE INVENTION

This invention relates generally to the sensing of electric charge in a relative sense and indicating quantitatively a change in potential for large bodies such as the earth which changes are related to various atmospheric and other natural phenomena. It is well known that a continuous fair weather atmospheric electric current condition exists with a vertical potential gradient from the earth to the upper atmosphere and that various properties of this electrical condition can be measured. For example, both the air-earth conduction current and the potential gradient are shown to exhibit a sunrise effect and these quantities exhibit a diurnal variation as well as annular and other variations. The apparatus used in such experiments, however, does not provide a means for indicating the charge on a body independent of a reference or quantatively detecting a change in that charge level independent of other references and, accordingly, the detection of this phenomenon and its correlation with natural phenomena has not heretofore been possible.

BRIEF SUMMARY OF THE INVENTION

The present invention provides a novel method for sensing the charge on a large body such as the earth and by repeated measurements sensing quantitatively changes in that charge level. To practice the method a preferred apparatus consists of a vertical quartz tube filled with mercury and connected with a resevoir which can be varied in height such that the height of the mercury column in the quartz tube can be varied. An electrode on the outside surface of the quartz column is connected to an electrometer or an electrostatic voltmeter, the low terminal of which is connected to the mercury column and both of which are connected to the body, the charge of which is to be sensed. A measurement sensing relative charge level is made by first short-circuiting the electrometer thus stabilizing the entire apparatus at the potential of the body (the earth) to which it is connected. The level of the mercury is then caused to move back and forth past the position of the electrode on the mercury column with the electrometer open-circuited during the passage of the mercury in one direction. When open-circuited the electrometer provides a potential indication which is a direct measure of the charge induced on the electrode on the tube and a plurality of such measurements provides a quantitative indication of the change in the level of the charge of the body to which the apparatus is connected.

DESCRIPTION OF THE PREFERRED EMBODIMENT AND METHOD

Figure 1:
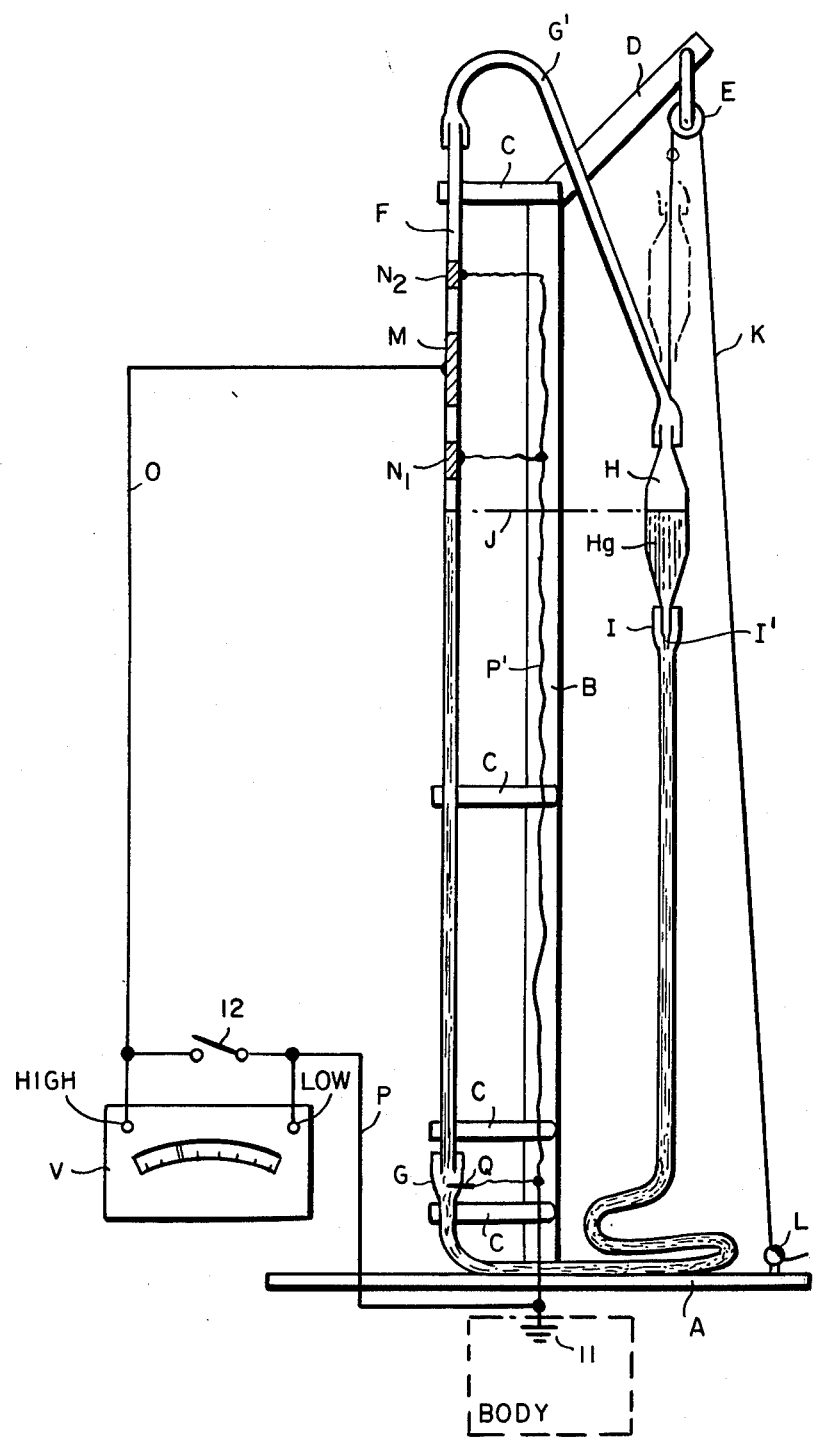
FIG. 1 is a view in side elevation of the apparatus employed to practice the invention.
Figure 2:
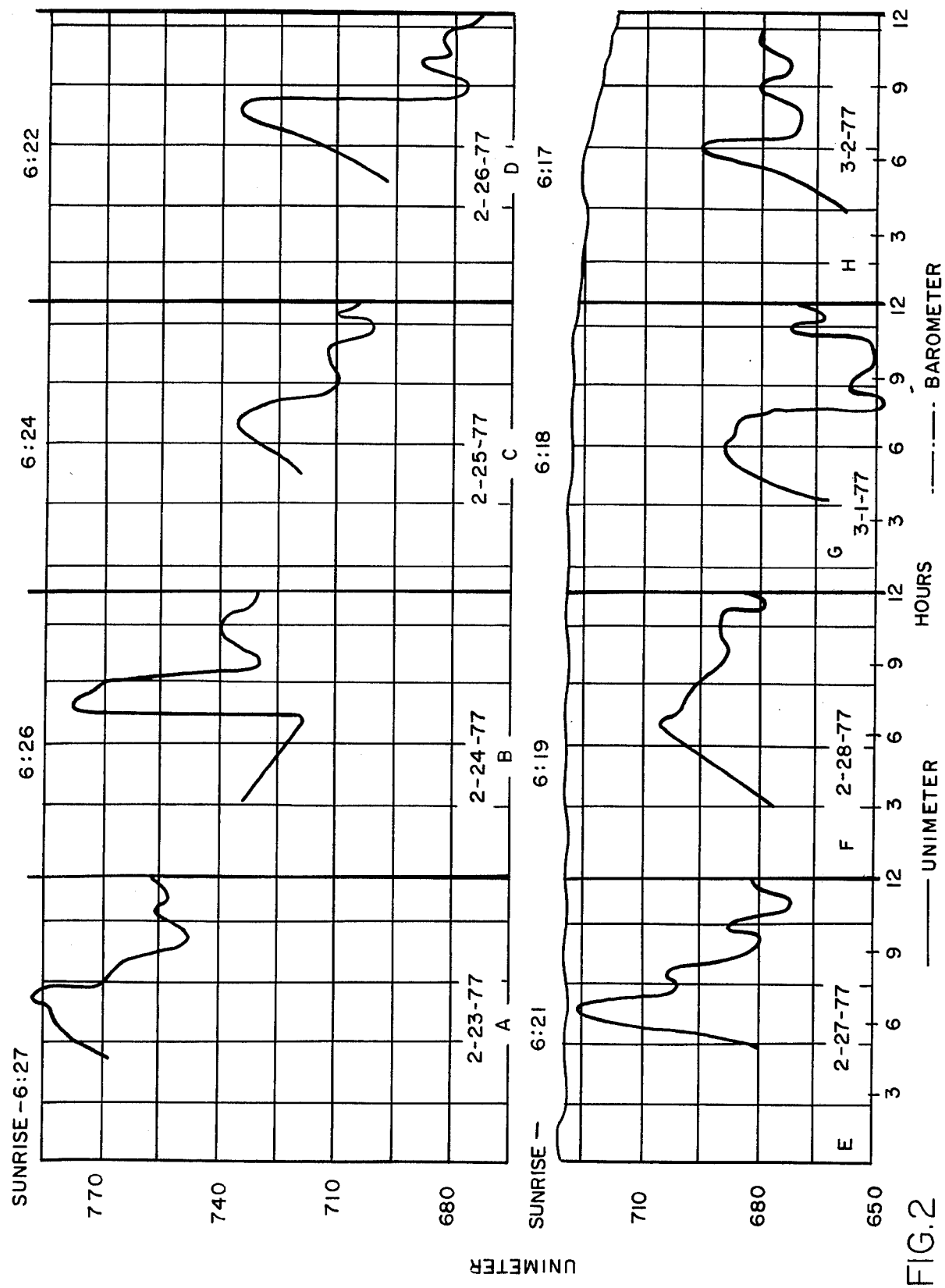
FIGS. 2A-H inclusive show measurements made in accordance with the invention on eight successive days indicating a correlation of measurement of earth potentional to the sunrise.

For practicing the method a preferred apparatus is as shown in FIG. 1. The apparatus consists essentially of a flat base A to which is rigidly connected an upright support B having a plurality of crossarms C. The base A, upright B and crossarms C provide for support in a substantially vertical position of a quartz tube F which extends through holes in the crossarms C and is connected by a tight force fit at its bottom with a flexible tubing G. The vertical tube F may be made of other dielectric material and for example may have an inside diameter of 2mm with as thin a wall for the material of the tubing as practicable.

The tubing G extends through a slack length thereof to a glass reservoir H which is open at its top and bottom and sealed by tight press fit at its bottom I to the length of tubing G. A second piece of flexible tubing G' is sealed by press fit at the top of reservoir H and at its other end by tight press fit to the open top of rigid tubing F. The reservoir H has at each end a smaller diameter extension for a tight seal fit with the tubing G and G' respectively. At the lower end this extension is drawn down to a small inner diameter I' which limits the rate of fluid flow for the mercury when the level of the reservoir is changed.

The rigid tubing F, the two pieces of flexible tubing G and G' and the reservoir H, all interconnected by tight press fit seals of the tubing around the open projections of the rigid tubing F and the reservoir H, form a sealed closed system which is charged with a quantity of conductive fluid preferably mercury Hg. The mercury Hg should preferably be as free of oxide as possible and the apparatus may be charged by drawing a supply of mercury from the center of a bottle of chemically pure mercury by means of a syringe and injecting the mercury into the apparatus before the final closure or press fit seal between the resevoir H and the upper press fit seal to tubing G' is made. To maintain a slight positive pressure within the sealed system this loading of the mercury can be done when the apparatus and the mercury are cooler than normal room temperature thereby providing a small positive internal pressure within the closed system.

The reservoir H is supported by means of a flexible cord K which passes over a pulley E supported at the top of the upright B by an extending arm D. The lower end of the cord K can be snubbed against an eye ring or other retaining member L fixed to the base A. By adjusting the length of the cord K, which is payed out or taken in, the effective height of the reservoir H can be adjusted from a position where the mercury level at J is below an electrode system hereinafter described to a higher position where the mercury level is above at least a portion of the electrode system, as indicated.

The electrode system previously mentioned comprises in the apparatus shown in FIG. 1 a central conductor M in the form of an aluminum foil or conductive coating or other electrical conductive surface on the outer surface of tube F which is connected by conductor O to the high terminal on an electrometer or electrostatic volt meter V. The low terminal of the volt meter V is connected by conductor P to ground which represents the earth or other body the charge level of which is to be detected. As shown in FIG. 1 the body whose charge level is to be detected is indicated by the conventional electric symbol for ground 11. The electrode system further comprises two conductors N1 and N2 spaced from electrode M approximately equal distances above and below electrode M and being slightly smaller in size. The electrodes N1 and N2 serve as guard electrodes and they are electrically connected together by being joined to a conductor P' which is also connected to earth 11.

Electrical contact with the mercury Hg is made at the base of the rigid tube F by inserting a small steel needle Q through the flexible tubing G at the point directly below its press seal connection with the bottom of tube F. The needle Q is also connected to the conductor P' or otherwise directly connected to the object being measured as indicated by earth symbol 11 in FIG. 1. Provision is also made for connecting electrode M directly to earth object 11 and in FIG. 1 this is indicated by the short circuiting switch 12. When switch 12 is closed the voltmeter V is short circuited between its HIGH and LOW terminals whereby also the foil electrode M is directly connected to earth 11.

The general arrangement shown in FIG. 1 is subject to many modifications but the preferred apparatus as presently known has rigid tube F approximately 48 inches long constructed to type 204 fused quartz with a 2mm internal diameter. The flexible tubes are polyvinyl chloride tubing with 2mm ID and the reservoir H is made of glass. As previously stated the mercury must be as pure as reasonably possible and the ground needle Q should be of material that has no deleterious effect. For example, copper, silver and gold have been found to be a problem since they quickly render the meter inoperative. Steel without any other metal as a coating thereon which could contaminate the mercury has been found to be satisfactory. Furthermore, when the apparatus is initially sealed it is useful to pump down the interior with a vacuum pump to remove as much water vapor as possible. This together with the sealing at cool temperatures provide a positive vapor pressure that excludes the ingress of water vapor into the sealed system. If desired an inert atmosphere of helium can be used, again, at slightly positive pressure. The electrostatic voltmeter V may conveniently be a Rawson-Lush Instrument Company type 518 manufactured by the company of the same name at Acton, Massachusetts.

The operation of the apparatus to make a measurement will now be described. Initially, the reservoir H is raised and lowered to make initial internal contact on the inner surface of tube F with the conductive mercury. The preferred form of measurement is then made by adjusting the height of the mercury in reservoir H to the level J as indicated in FIG. 1 and closing switch 12 to ground all of the parts by connection to earth 11. The apparatus should be permitted to rest in this position for a short period of time. Then switch 12 is opened and the reservoir H is raised to raise the level of the mercury in the tube F to just above the upper foil guard electrode N2 at which time the electrostatic voltmeter V is read and recorded. Switch 12 is then closed reconnecting electrode M and the HIGH terminal of meter V to earth 11 and the reservoir H is lowered thereby lowering the level of mercury in tube F back down to the level below electrode N1 as indicated at J. After allowing the unimeter to stabilize the process can be repeated and another reading of the voltmeter V obtained after the mercury has been raised to the described upper position above electrode N2 with the switch open so that the electrode M is essentially isolated from all factors except its capacitive coupling to the mercury column within the tube F.

While the theory of operation of the unimeter is not precisely understood and applicant does not intend to be bound by any given theory of operation it is believed that the phenomenon exhibited in the meter readings obtained by the above method and apparatus result from the grounded column of mercury moving down inside the quartz tube to leave a negative charge on the inner surface of the tube as it uncovers that surface. The dielectric qualities of quartz or other excellent insulator of which the tube F is constructed prevent this negative charge from traveling over the surface and the outer electrode M has a positive charge induced thereon because of the presence of the bound inner charge on the opposed inner surface of the quartz wall of the tube. As described, the mercury column in tube F is lowered when the switch 12 is closed and thus the electrode M is grounded to earth 11 thereby creating the induced positive charge by driving electrons away from the electrode M through the conductor O to earth 11. There thus remains a negative charge on the inner surface of the quartz tube opposite the foil. During the measurement when the electrode M is disconnected from earth 11 by opening switch 12 and is essentially open-circuited by the capacitive type volt meter V, the grounded column of mercury climbing through the tube F removes the negative charge on the inside of the tube and places the inner surface of the tube at earth potential by virtue of direct conduction through the column of mercury to the earth 11 to which it is connected by means of the needle Q. The charge which is released from the middle foil M by this process results in a positive reading on the electrostatic volt meter V. The magnitude of the meter reading depends upon the potential of the earth object 11 which controls the amount of charge left on the inside of the tube in the previous step.

It is also possible to make measurements using the inverse order of steps from that just described. Thus measurements are possible by having the mercury at rest at the upper level above the electrode N2. The switch 12 is closed to establish the initial condition. With switch 12 closed the mercury Hg is lowered to level J and the switch 12 is then opened. With the switch 12 open the level of the mercury Hg is raised to above electrode N2 and the meter V is read and recorded. The switch 12 can then be closed and the mercury level retained at the upper level until the next measurement is made by repeating this sequence of steps.

In either form of measurement the guard electrodes N1 and N2 control leakage and improve results and furthermore make the measurement relatively independent of the next level J for the initial level of the mercury or the top level above electrode N2 to which the mercury is raised as the mercury is moved up and down past the electrode M.

The apparatus and method of the invention are useful for a wide variety of measurements on different objects but the primary utility at present relates to measurement of the earth potential changes and its correlation with natural phenomenon. These phenomena include the weather, barometric pressure and relative position of the earth to celestial bodies such as the sun and the moon. As an example of the few of the relationships which have been established, FIGS. 2 through 5 are presented showing data which has been recorded using the unimeter apparatus as shown and described herein.

FIGS. 2A-H inclusive show measurements taken with the unimeter during an interval on eight successive days which immediately preceded and followed sunrise. The period extended from Feb. 23, 1977 until Mar. 2, 1977. Over this 8 day interval local sunrise became progressively earlier from 6:27 AM on Feb. 23rd until 6:17 AM on Mar. 2d. On each day the peak reading on the unimeter was obtained at approximately sunrise and the progression of the peak to correspond to the earlier sunrise event can be seen.

Figure 3:
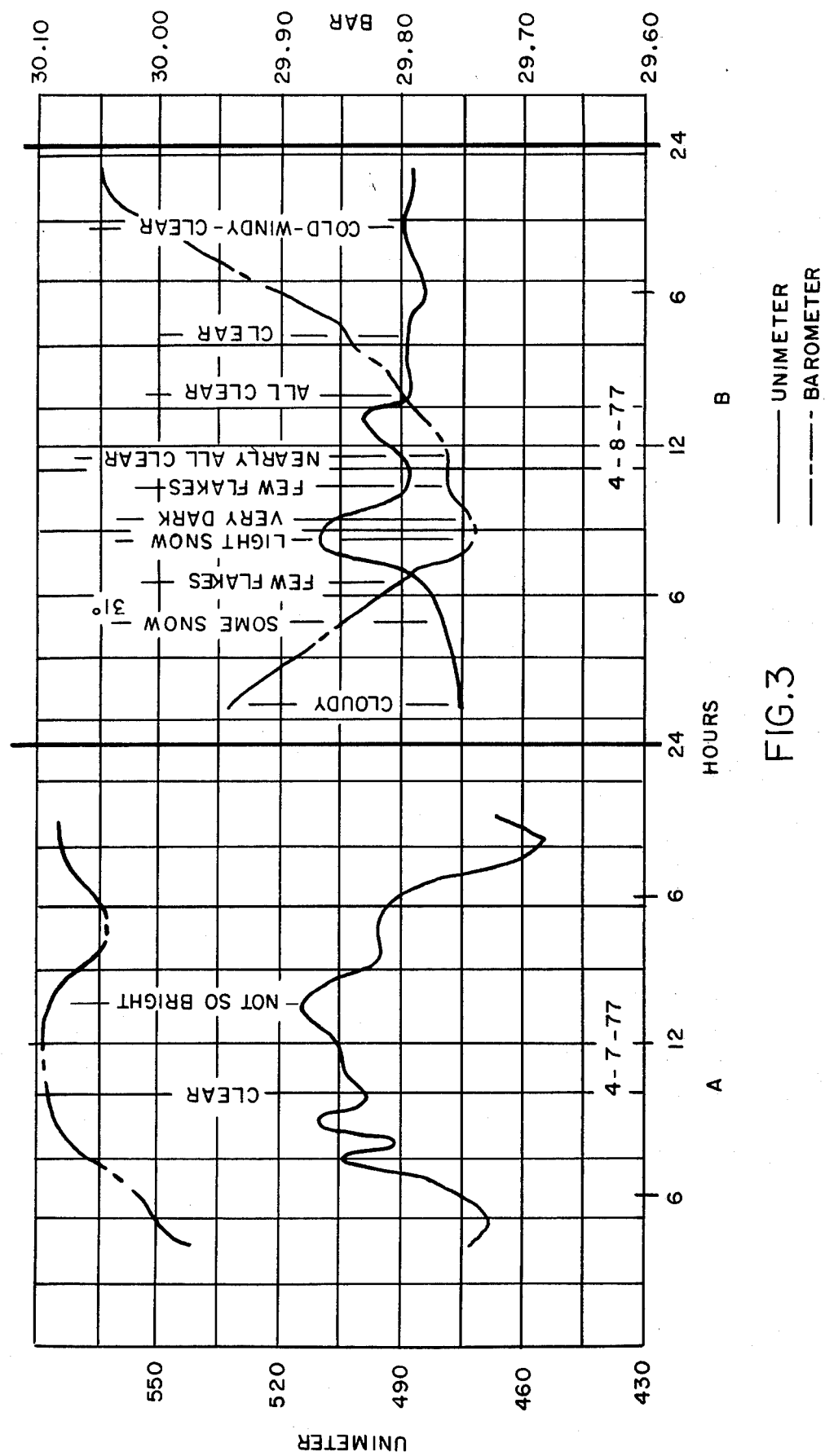
FIG. 3 shows a comparison of measurements made by the unimeter and the barometric barometer during a two-day period during which a fast moving storm passed through the area.

FIG. 3 shows the comparison of a continuous sequence of unimeter readings and corresponding barometric pressure for a two day interval during which a fast moving storm progressed through the local area in which the measurements were made. As indicated in FIG. 3 the unimeter started dropping on Apr. 7th at approximately 1:30 PM during relatively clear weather and approximately seven and one-half hours before the barometer started to drop. At 5:00 AM on Apr. 8th during a light snow storm the unimeter began a gradual increase in its reading indicating improving weather conditions while the barometer continued to drop for another 3 hours before reversing its trend.

Figure 4:
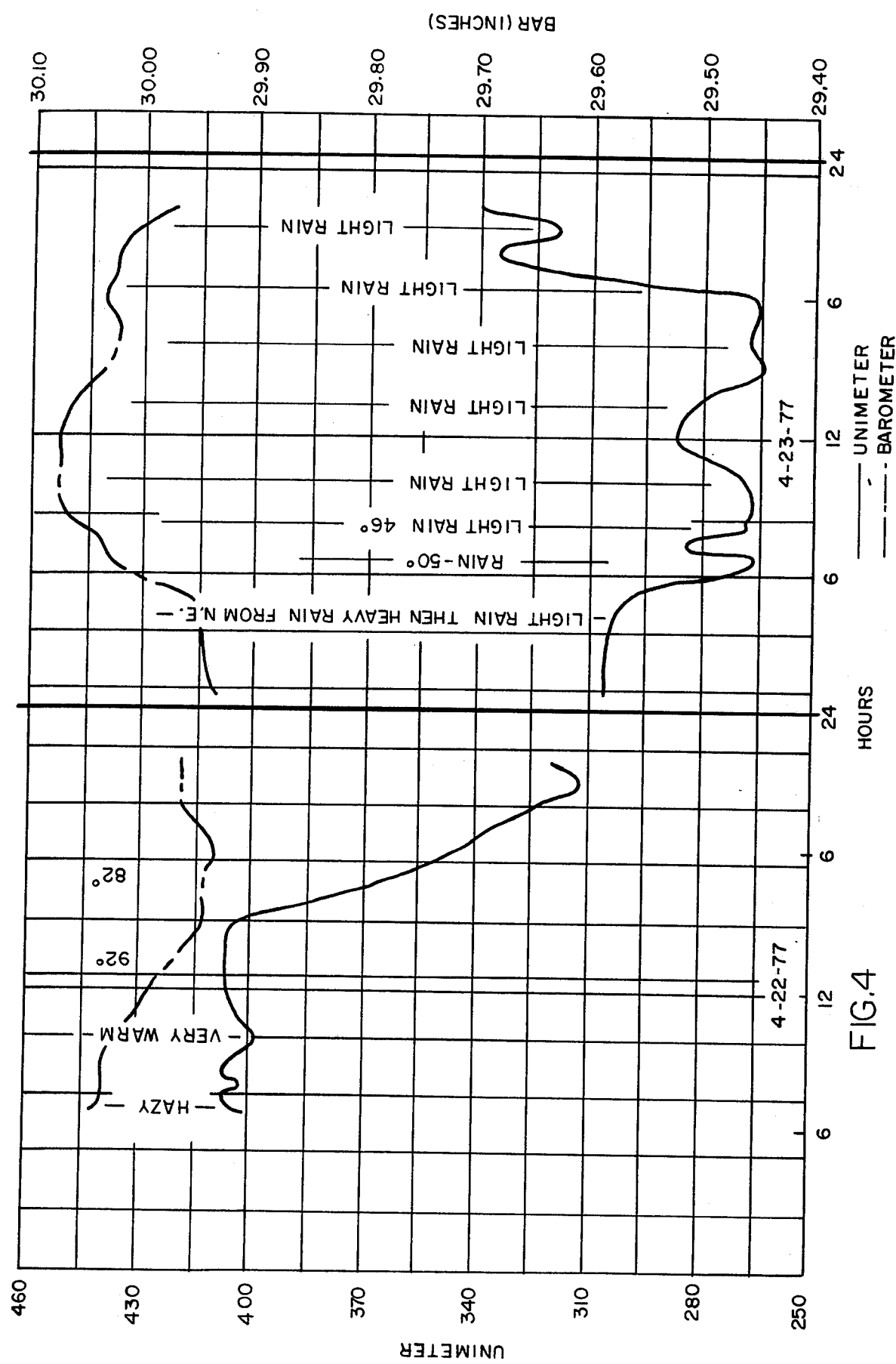
FIGS. 4 and 5 plot barometric pressure and readings on the unimeter for a four-day interval with notations indicating the local weather conditions during the time of measurement.
Figure 5:
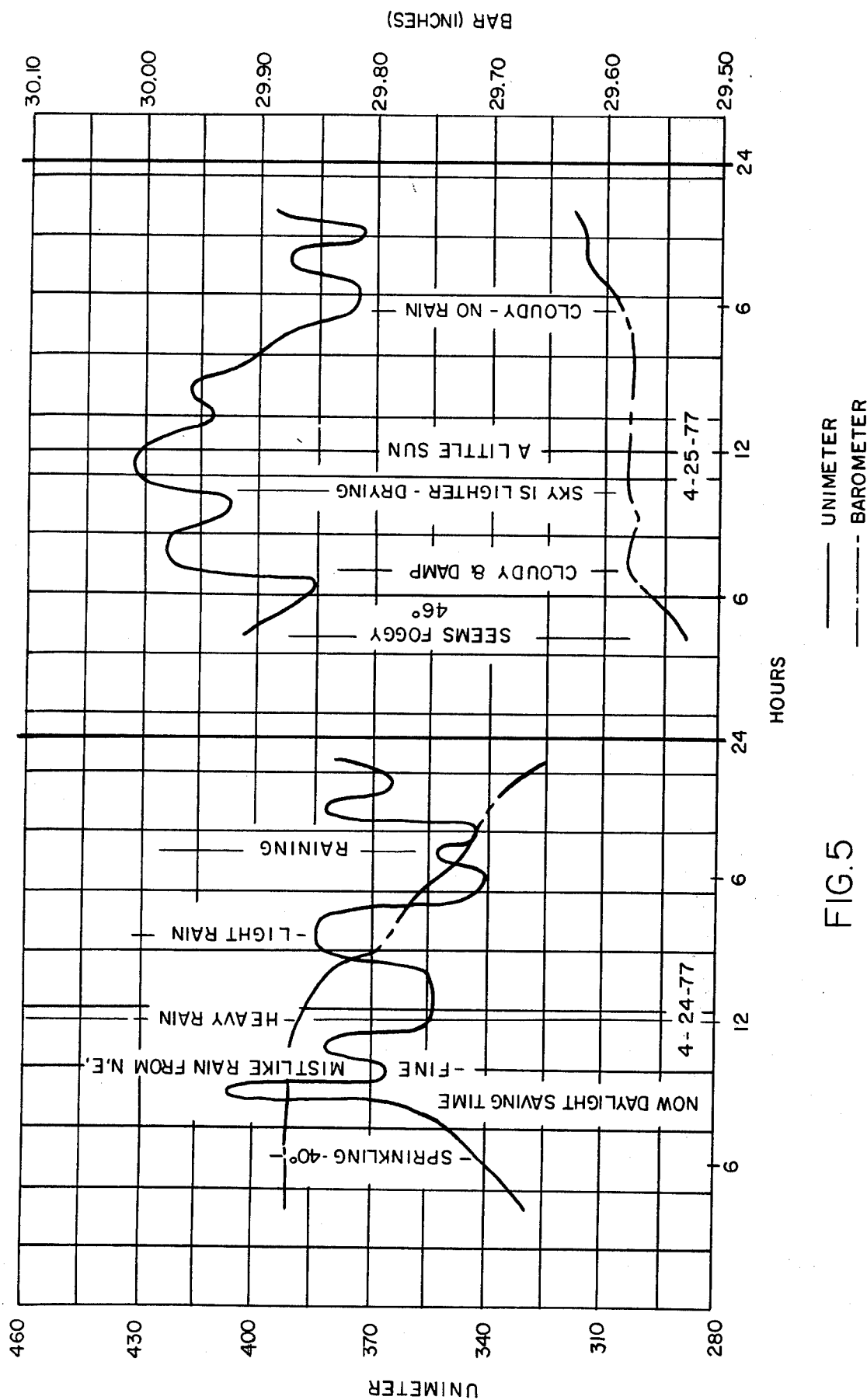

FIGS. 4 and 5 show a 4-day interval during which unsettled weather was correlated in advance with substantial change in the unimeter reading. About 3:00 PM on Apr. 22d the unimeter started dropping very rapidly and reached a low point at 6:45 AM on Apr. 23rd. Rain started at 5:00 AM but during this time the barometer was nearly steady and started to gain about the time it started to rain, while the unimeter was still going down. It rained all day on the 23rd with the unimeter low and the barometer high, until 6:00 PM when the unimeter began to rise and the barometer started to drop. On Apr. 24th the unimeter indicated very unsettled weather but that the worst was over, during which time the barometer dropped further. On Apr. 25th the barometer reached its lowest point and was so low all day, while the weather improved as the unimeter was indicating.

It will be clear from the present teaching that the change in charge level which can be measured by the apparatus and method of the present invention can be correlated with various naturally occurring phenomena and under controlled conditions used to determine correspondence in certain conditions. Thus although the sunrise is detected as a pronounced change in charge level of the earth, the influence of other celestial bodies also can be shown to influence the readings. Furthermore, while the advance prediction of weather from observations at a single station show good advance correlation, the results of such measurements from a geographically disbursed network of such stations would provide for more precise trend prediction.

While the disclosure and measurements reported herein refer to the earth as the body whose charge is being sensed, the apparatus is useful in relation to any body where suitable isolation of that body from outside influence can be obtained. Thus use of the unimeter method on airborn or satellite vehicles is contemplated to indicate charge and hence potential charge independent of a reference level.

Other applications of the unimeter method and apparatus will occur to those skilled in the art from the present teaching as well as modifications for achieving the novel measurements described herein. Accordingly, applicant does not intend the invention to be interpreted as limited to the specific apparatus and method disclosed but only by the scope of the appended claims.

I claim:
1. The method of sensing the electric potential of a body and indicating variations thereof comprising the steps of
  (a) providing a substantially vertical column of conductive fluid which is movable to position the fluid level at variable vertical positions including a second position opposed and closely spaced from a capacitor electrode and a first position remote from and below said capacitor electrode;
  (b) establishing a unipotential initial condition between said conductive fluid column and said capacitor electrode by electrical connection of both to said body and providing an electrometer having a short circuit connection between a low terminal and a high terminal which are connected respectively to said column and said capacitor electrodes;
  (c) providing an initial position for the level of said conductive fluid column at said first position remote from said capacitor electrode;
  (d) moving said conductive fluid column while in contact with said body up and down between said first and second positions;
  (e) removing said short circuit connection between said electrometer terminals prior to the motion of said fluid in the upward direction between said first and second positions;
  (f) observing the reading on said electrometer and replacing said short circuit connection between said electrometer terminals after completing said motion in said upward direction one direction and before moving said fluid in the downward direction; and
  (g) after a period of stabilization repeating said steps (d) through (f) to indicate variations in said electric potential of said body from the successive readings of said electrometer.

2. The method according to claim 1 wherein said body is the earth.

3. The method according to claim 1 wherein said body is a vehicle supported without contact with the earth and said method is performed on said vehicle.

4. The method of sensing the electric potential of a body and indicating variations thereof comprising the steps of
  (a) providing a substantially vertical column of conductive fluid which is movable to position the fluid level at variable vertical positions including a first position opposed and closely spaced from a capacitor electrode and a second position remote and from below said capacitor electrode;
  (b) establishing a unipotential initial condition between said conductive fluid column and said capacitor electrode by electrical connection of both to said body and providing an electrometer having a short circuit connection between a low terminal and a high terminal which are connected respectively to said column and said capacitor electrodes;
  (c) providing an initial position for the level of said conductive fluid column at said first position;
  (d) moving said conductive fluid column while in contact with said body down from said first to second positions;

(e) removing said short circuit connection between said electrometer terminals after said fluid level has reached said second position;
(f) raising said fluid level to said first position;
(g) observing the reading on said electrometer and replacing said short circuit connection between said electrometer terminals after completing said motion in said upward direction; and
(h) after a period of stabilization repeating said steps (d) through (g) to indicate variations in said electric potential of said body from the successive readings of said electrometer.

5. The method according to claim 4 wherein said body is the earth.

6. The method according to claim 4 wherein said body is a vehicle supported without contact with the earth and said method is performed on said vehicle.

7. Apparatus for measuring electric charge on a body independent of a reference comprising:
   an elongated dielectric tube supported in a substantially vertical position;
   a reservoir containing a supply of conductive fluid;
   conduits connecting said reservoir with the top and bottom of said tube to form a closed sealed path for said fluid;
   a conductive electrode around a portion of said tube at a position intermediate said top and bottom;
   means for raising and lowering the level of said fluid in said tube by flow from and to said reservoir such that said level can be raised above said electrode and lowered below said electrode;
   means for making electrical contact with said fluid at said bottom of said tube;
   a circuit directly connecting said contact with said body;
   an electrometer in circuit having a high terminal connected to said electrode and a low terminal connected to said body, and
   means for selectively short circuiting said terminals and connecting said electrode to said body.

8. Apparatus according to claim 7 wherein said conductive fluid is mercury.

9. Apparatus according to claim 8 wherein said means for making electric contact is a metal needle passing through the wall of said path, said metal not being deleterious to the mercury action.

10. Apparatus according to claim 7 and including a pair of guard electrodes on said tube spaced above and below said conductive electrode, said guard electrodes electrically connected to said body.

11. Apparatus according to claim 8 wherein said conduits are flexible tubing and said means for raising and lowering the level of fluid in said tube comprises means for adjusting the height of said reservoir relative to said tube.

12. Apparatus according to claim 11 wherein said reservoir has a constricted opening at its lower end to limit flow rate of the mercury in the conduit connected thereto.

* * * * *